US007402789B2

(12) United States Patent
Bock

(10) Patent No.: US 7,402,789 B2
(45) Date of Patent: Jul. 22, 2008

(54) METHODS FOR PIXEL BINNING IN AN IMAGE SENSOR

(75) Inventor: Nikolai E. Bock, Pasadena, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/476,018

(22) Filed: Jun. 28, 2006

(65) Prior Publication Data

US 2006/0243890 A1    Nov. 2, 2006

Related U.S. Application Data

(63) Continuation of application No. 10/739,012, filed on Dec. 19, 2003, now Pat. No. 7,091,466.

(51) Int. Cl.
*H01J 40/14* (2006.01)

(52) U.S. Cl. .................. 250/214 R; 250/208.1

(58) Field of Classification Search ............... 250/208.1, 250/214 R, 214.1; 257/290, 291, 440; 348/301, 348/307–312

See application file for complete search history.

(56) References Cited

U.S. PATENT DOCUMENTS

| 4,996,413 | A | * | 2/1991 | McDaniel et al. | ......... 250/208.1 |
| 6,021,172 | A | | 2/2000 | Fossum et al. | |
| 6,452,153 | B1 | | 9/2002 | Lauxtermann et al. | |
| 6,480,227 | B1 | * | 11/2002 | Yoneyama | ................. 348/308 |
| 6,794,627 | B2 | * | 9/2004 | Lyon et al. | ............... 250/208.1 |

OTHER PUBLICATIONS

U.S. Appl. No. 10/705,843, filed Nov. 13, 2003, Krymski.
Faycal Saffih et al.—"Multiresolution CMOS Image Sensor," Technical Digest of SPIE Opto-Canada, May 2002, pp. 425-428.
Zhimin Zhou et al.—"Frame-Transfer CMOS Active Pixel Sensor with Pixel Binning," IEEE Transactions on Electron Devices, vol. 44, No. 10, Oct. 1997, pp. 1764-1768.

* cited by examiner

*Primary Examiner*—Que T Le
(74) *Attorney, Agent, or Firm*—Dickstein Shapiro LLP

(57) ABSTRACT

Embodiments provide structures and methods for binning pixel signals of a pixel array. Pixel signals for pixels in an element of the array are binned simultaneously. Pixels in an element are located in a plurality of rows and columns. In exemplary embodiments, pixel voltage signals or pixel current signals are binned.

20 Claims, 10 Drawing Sheets

METHODS FOR PIXEL BINNING IN AN IMAGE SENSOR

CROSS-REFERENCE TO RELATED APPLICATIONS

The present application is a continuation of U.S. patent application Ser. No. 10/739,012, filed on Dec. 19, 2003, now U.S. Pat. No. 7,091,466 the disclosure of which is incorporated herein by reference in its entirety.

The present invention relates generally to signal binning, and more specifically to signal binning in an image sensor.

BACKGROUND OF THE INVENTION

Binning operations for Charge-Coupled Devices (CCD) are well-known in the art. Charges from adjacent pixels in a column are typically summed in a horizontal register in a CCD sensor. Charges from adjacent columns are then summed at an output node. The resulting operation produces a binned signal having a reduced resolution, but improved signal-to-noise ratio characteristics. Since the binning takes place in the charge domain, the summation of signals is relatively noiseless.

Complimentary metal oxide semiconductor (CMOS) active pixel sensors (APS) have gained increased usage over recent years. CMOS image sensors are generally known in the art and are discussed, for example, in Nixon et al., "256× 256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994). See also U.S. Pat. Nos. 6,177,333 and 6,204,524, which are assigned to Micron Technology, Inc., and describe operation of conventional CMOS image sensors, the contents of which are incorporated herein by reference.

Although typically used in CCD sensors, binning techniques have been developed for CMOS active pixel sensors. In one known technique summation for frame-rate transfers are implemented through the column charge integration amplifier (CIA) in a pixel sensor. This technique is discussed in an article written by Zhmin Zhou, et al., titled "Frame-Transfer CMOS Active Pixel Sensor with Pixel Binning", IEEE Transactions On Electron Devices, vol. 44, 10, Oct. 1997, pp. 1764-1768 ("Zhou"). According to Zhou, charge summation is integrated in a column CIA for the vertical direction, and in a global CIA in the horizontal direction. Signals from selected rows in a kernel or element of an array (i.e., a selected resolution) are integrated by column integrators one row at a time. After the row summation is completed, consecutive columns are integrated after each reset of the global integrator.

Such configurations, however, tend to require greater operating times and introduce excessive kTC noise in the imaging device. What is needed is a binning operation that functions within the pixel array to minimize operation time and/or noise.

BRIEF SUMMARY OF THE INVENTION

Embodiments of the invention provide structures and methods for binning pixel signals of a pixel array. Pixel signals for pixels in an element of the array are binned simultaneously. Pixels in an element are located in a plurality of rows and columns. In exemplary embodiments of the invention, pixel voltage signals or pixel current signals are binned.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

In the following detailed description, reference is made to the accompanying drawings, which form a part hereof, and in which is shown by way of illustration of specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "pixel" refers to a picture element unit cell containing a photo-conversion device and other devices for converting electromagnetic radiation to an electrical signal. For purposes of illustration, a representative pixel cell is illustrated in the figures and description herein, and, typically, all pixel cells in an image sensor will have a similar configuration. An "element" or "pixel element" refers to a group of pixels that have signals which can be binned (summed).

Figure 1:
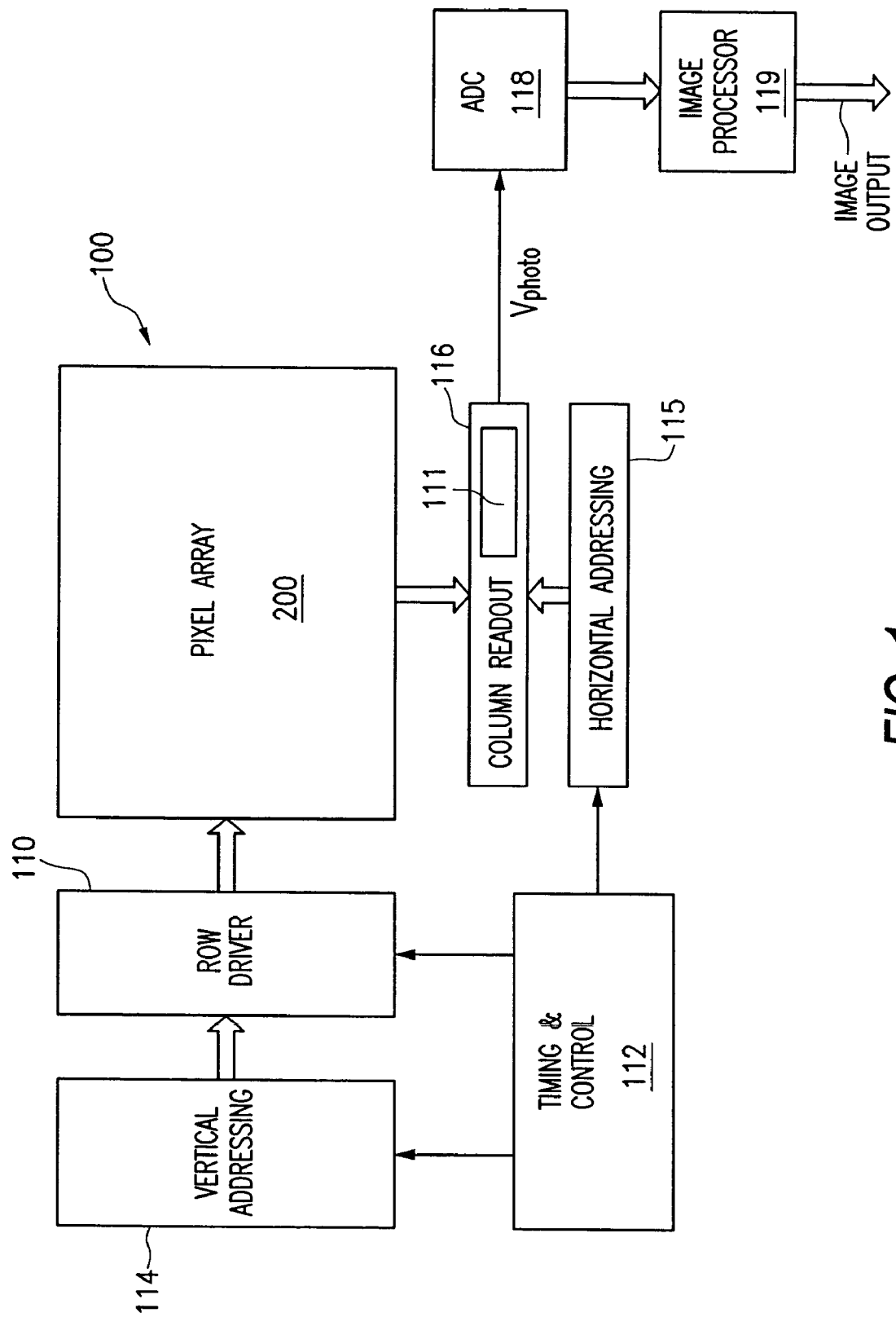
FIG. 1 is a block diagram of an image sensor according to an exemplary embodiment of the invention.

FIG. 1 shows a CMOS image sensor 100 according to an exemplary embodiment of the invention. The image sensor 100 can be operated in both binning and non-binning modes. The structure and operation of image sensor 100 is described generally in connection with FIG. 1 and described in more detail in connection with FIGS. 2-14 below.

Image sensor 100 includes an array of pixels 200. Timing and control circuitry 112 provides timing and control signals to enable the readout of signals stored in the pixels. Array 200 has M by N pixels and, in general, the values of M and N can vary as desired. The imager 100 is read out under the control of the timing and control circuitry 112, which selects a particular row or rows of pixels in the array 200 by controlling the operation of vertical addressing circuit 114 and row drivers 110. Charge signals stored in the selected row of pixels are provided to readout circuitry 116. Readout circuitry 116 includes a column circuit 111 connected to columns of array 200. The column circuit 111 includes binning circuitry (not shown) for binning pixel signals from pixels of the array 200. The pixels of the columns can be read out in a specified order using a horizontal addressing circuit 115.

Each pixel or pixel element provides a signal $V_{photo}$, representing accumulated charge during an integration period, which is provided at the output of the readout circuitry 116. This signal $V_{photo}$ is digitized by an analog to digital converter (ADC) 118. The digitized signals are then fed to an image processor 119 to form a digital image.

Figure 2:
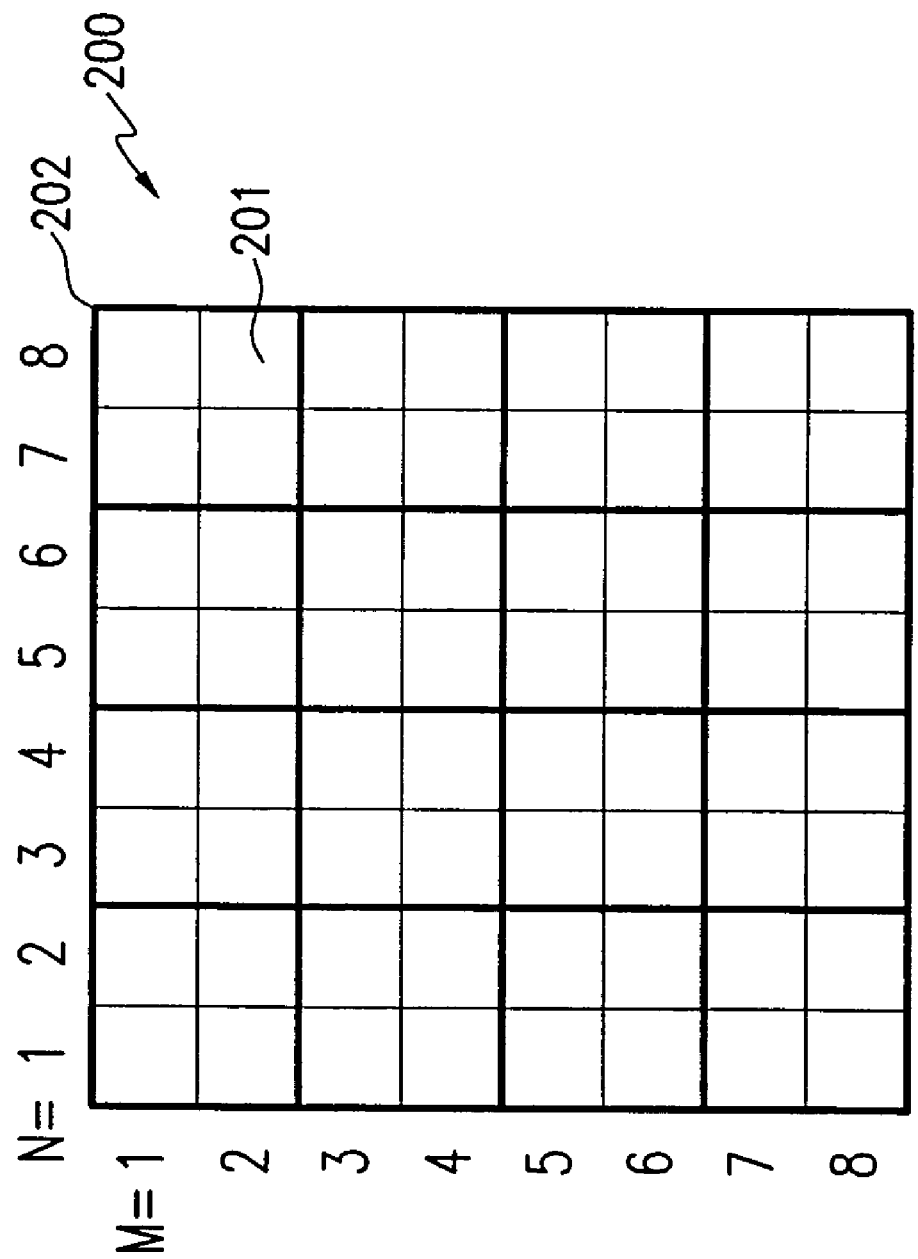
FIG. 2 is a block diagram of a pixel array illustrated in FIG. 1 according to an exemplary embodiment of the invention.

FIG. 2 is a block diagram of an array 200 of pixels 201 according to an exemplary embodiment of the invention. As shown in FIG. 2, the pixels 201 are arranged in N columns and M rows. In the exemplary embodiments of the invention, the array 200 is depicted having eight columns and eight rows. It should be appreciated, however, that other numbers of columns and rows are possible. In the illustrated embodiment, the pixels 201 are further arranged in two-by-two pixel elements 202, that is, each element 202 includes four neighboring pixels 201 spanning two rows and two columns. For example, where a pixel cell of row M and column N is indicated by the notation (M,N), one element 202 includes pixels (1,1), (1,2), (2,1), and (2,2).

Figure 3:
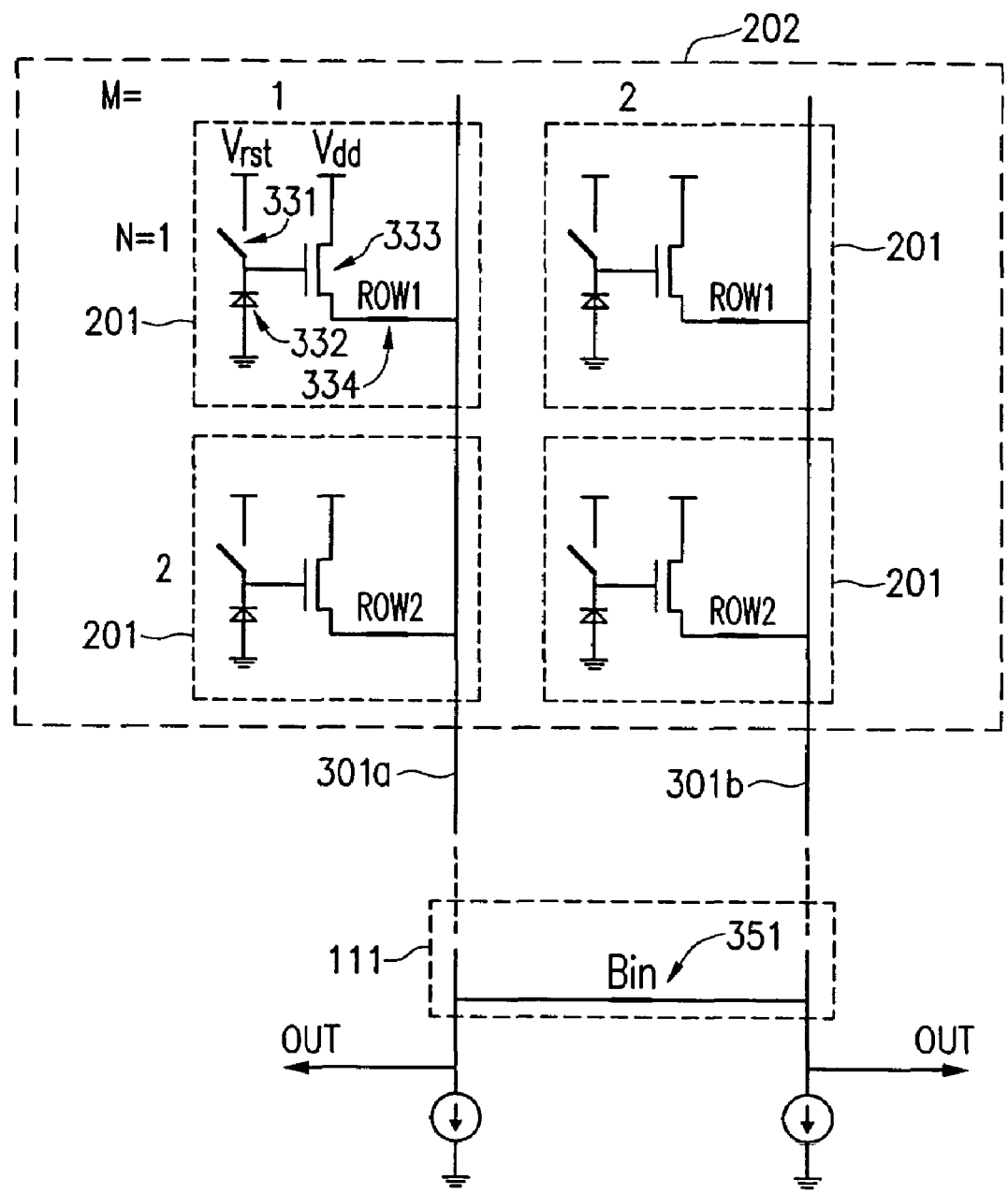
FIG. 3 is a diagram of an element of the array of FIG. 2 and column circuitry associated with the element according to an exemplary embodiment of the invention.

FIG. 3 is a diagram of an element 202 and its associated column circuit 111 according to an exemplary embodiment of the invention. In the exemplary embodiment of FIG. 3, each pixel 201 is connected to a column line 301a, 301b when row select switch 334 is conductive. Each pixel 201 also includes a photo-conversion device, which is illustratively a photodiode 332. The photodiode 332 is connected by switch 331 to a voltage source Vaa. When switch 331 is conductive, the photodiode 332 is reset to a reset voltage $V_{rst}$ which is Vaa. Photodiode 332 is also connected to the gate of a pixel source follower transistor 333, which amplifies the signal from the photodiode 332 for readout to readout circuitry 116 (FIG. 1) via column line 301a, 301b. Specifically, pixels 201 in column 1 are readout via column line 301a and pixels 201 in column 2 are readout via column line 301b. Switches 331 and 334 can be implemented as transistors resulting in a three-transistor (3T) pixel 201 configuration.

It should be appreciated, however, that other pixel configurations can be used to practice the invention, such as, for example, a four-transistor configuration (4T), which can include a transfer transistor between the photodiode 332 and the pixel source follower transistor 333, a five-transistor configuration (5T), which can further include an electronic shutter, or other transistor configurations. Additionally, image sensor 100 can include circuitry for performing correlated double sampling. Typically, for CDS, a pixel cell further includes a sensing node, e.g., a floating diffusion region, which is reset to a predetermined voltage prior to readout of the charge integrated in the photodiode. The pixel reset signal $V_{rst}$ is first readout from the sensing node. Then, the charge integrated by the photodiode is transferred to the sensing node and a pixel image signal $V_{photo}$ is read out. The two values, $V_{rst}$ and $V_{photo}$, are subtracted by a differential amplifier thereby reducing noise.

As shown in FIG. 3, a binning switch 351 is included in the column readout circuit 111. Binning switch 351 can be implemented as a switch, transistor, or other appropriate circuit. When switch 351 is conductive, column lines 301a and 301b are connected allowing pixel signals for pixels in element 202 to be binned. In the exemplary embodiment of FIG. 3, binning switch 351 is a simple modification to a conventional column circuit that enables binning of the pixel signals of element 202.

Figure 4:
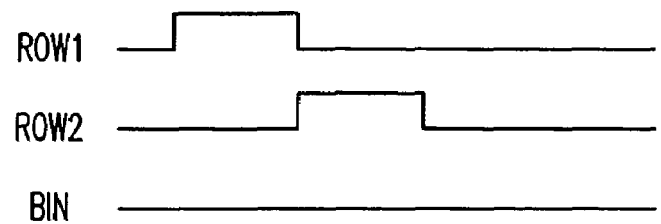
FIGS. 4-6 are timing diagrams illustrating the operation of the image sensor of FIG. 1 according to exemplary embodiments of the invention.

Image sensor 100 can be readout in both a non-binning and binning mode. FIG. 4 depicts the operation of image sensor 100 in a non-binning mode according to an exemplary embodiment of the invention. In the non-binning mode, image sensor 100 operates like a conventional image sensor. Accordingly, pixel cells of array 200 are read out row by row and a pixel signal is obtained for each pixel individually. Referring to FIG. 4, a row 1 select (ROW 1) signal is pulsed high to activate switches 334 and connect pixels of row 1 to column lines 301a, 301b for readout. After row 1 is read out, ROW 1 goes low and row 2 select (ROW 2) is pulsed high to activate switches 334 and connect pixels of row 2 to column lines 301a, 301b for readout. In the non-binning mode, the Bin signal remains low throughout the readout process so that switch 351 is not conductive and the loads on the column lines 301a, 301b are not connected to each other.

Figure 5:
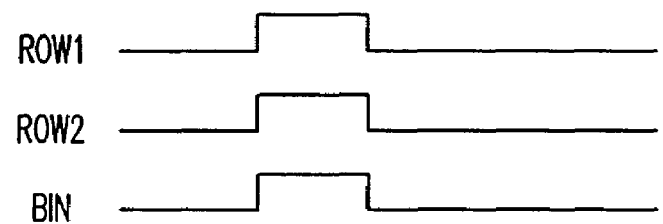

FIG. 5 depicts the operation of image sensor 100 in a binning mode according to an exemplary embodiment of the invention. In the binning mode, pixel signals of each pixel of element 202 are simultaneously binned in both the horizontal and vertical directions. The simultaneous binning of pixel signals in the horizontal and vertical directions reduces operation time of image sensor 100 and reduces kTC noise as compared to the prior art. Referring to FIG. 5, for the binning mode, ROW 1 and ROW 2 are simultaneously pulsed high to activate respective switches 334 and connect pixels of rows 1 and 2 to column lines 301a, 301b for readout. Also, at the same time ROW 1 and ROW 2 go high, Bin is pulsed high to activate binning switch 351 to connect the loads on columns lines 301a and 301b to each other. Thereby, the image sensor 100 is operated in the two-by-two binning mode and the pixel signals for the four pixels of element 202 are simultaneously binned and read out.

Figure 6:
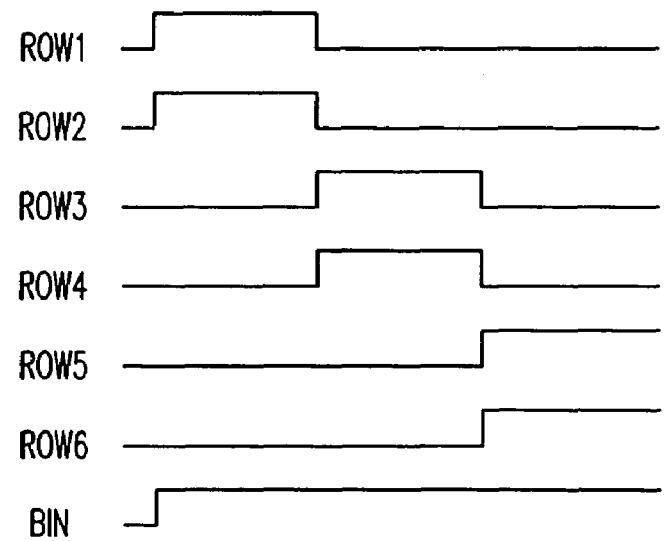

As shown in FIG. 6, beginning with rows 1 and 2, elements 202 are readout sequentially by pulsing respective ROW X signals, where X is the row number corresponding to rows containing the elements to be read out. At the same time, Bin goes high to activate binning switch 351 to bin the pixel signals from columns 301a and 301b. After ROW 1 and ROW 2 go low, ROW 3 and ROW 4 are pulsed high for readout of the elements in rows 3 and 4. Likewise, after ROW 3 and ROW 4 go low, ROW 5 and ROW 6 are pulsed high for readout of the elements in rows 5 and 6. Bin remains high as elements 202 are read out.

In the embodiment of FIGS. 3-5, binning is implemented by voltage summation via column lines 301a, 301b. This embodiment advantageously provides binning using a simple structure and operation. This embodiment, however, can result in a nonlinear element output signal when there is a large difference, e.g., more than 100 millivolts (mV), between individual pixel signals of element 202. Since the drain current of the pixel source follower transistor 333 depends on its source potential, the mutual influence of transistors with connected source regions can cause nonlinearity of the element output signal.

Figure 7:
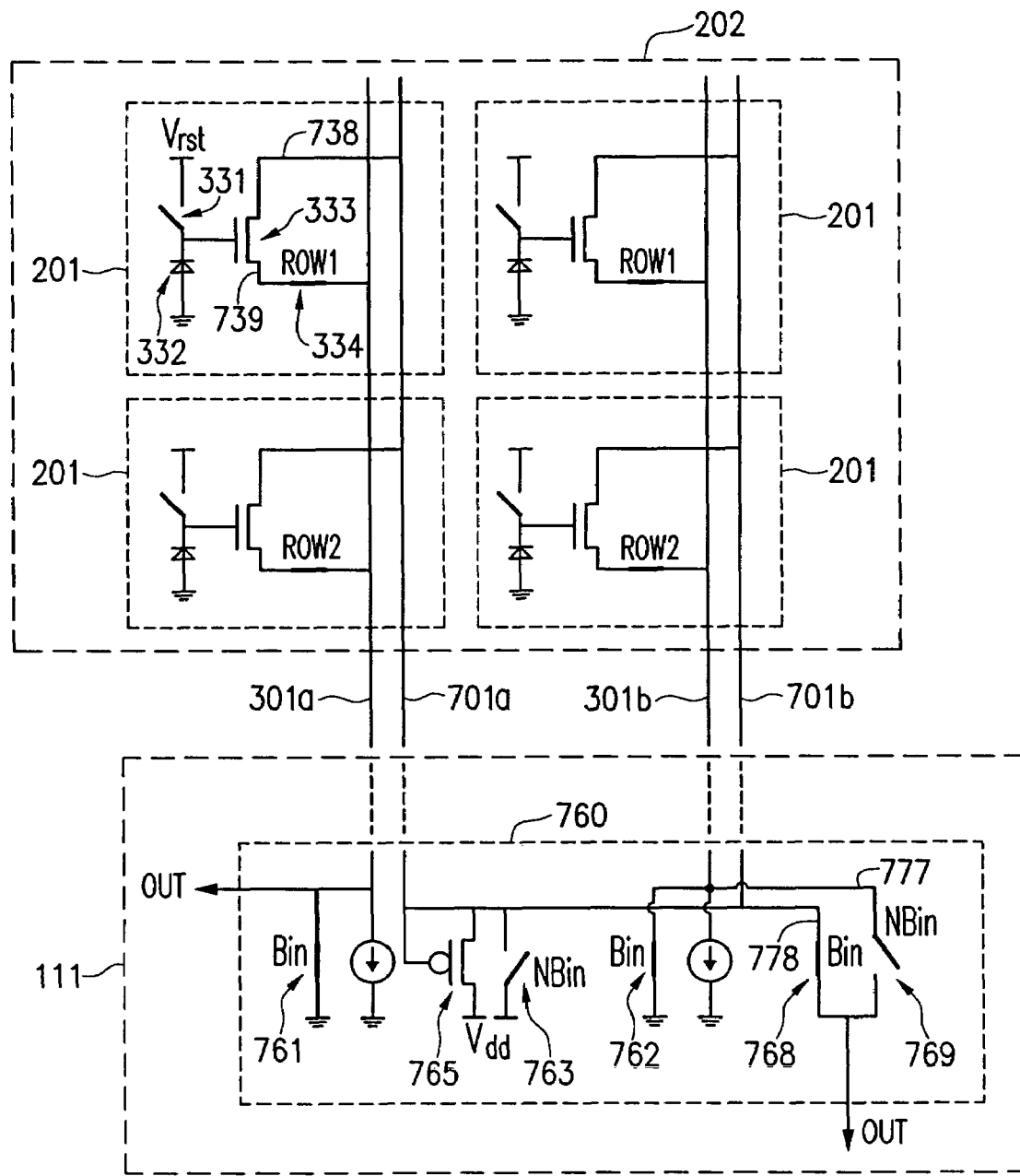
FIG. 7 is a diagram of an element of the array of FIG. 2 and column circuitry associated with the element according to another exemplary embodiment of the invention.

Alternatively and according to another exemplary embodiment of the invention, binning can be implemented by summing pixel current signals rather than voltage. FIG. 7 depicts element 202, which includes four pixels 201. For the illustrated embodiment of FIG. 7, column circuit 111 includes current binning circuitry 760. The current binning circuitry 760 includes five switches 761, 762, 763, 768, 769 and a PMOS load transistor 765. For the binning mode, an input to column circuit 111 is connected to the drain regions 738 of the pixel source follower transistors 333 of each pixel 201 in element 202 via lines 701a, 701b. Therefore, four pixel source follower transistors 333, which act as amplifiers, can drive the transistor 765 load. Thus, the output voltage of transistor 765 is directly proportional to the sum of the currents from the pixels 201 in element 202. The gain of the circuit depends on the size of transistor 765 and is, illustratively, equal to a unity gain. For the binning mode, switches 761, 762, and 768, which receive a Bin signal, are conductive, while switches 763 and 769, which receive an NBin signal, are non-conductive. The switches 761, 762, 763, 768, 769 can be any appropriate switching circuitry, such as, for example, transistors, and can operate as described below to enable image sensor 100 to operate in both the non-binning and binning modes.

Figure 8:
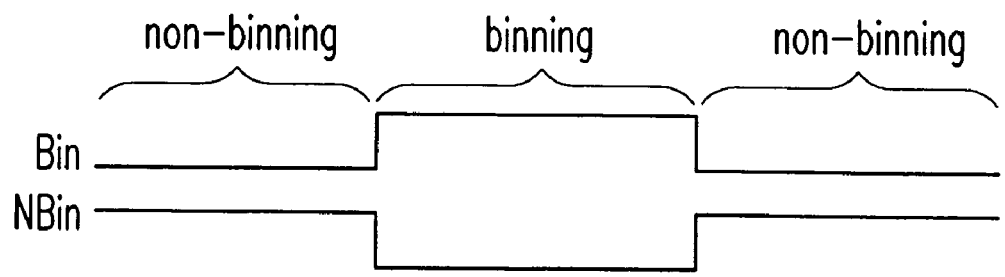
FIG. 8 is a timing diagram illustrating the operation of the image sensor of FIG. 1 according to another exemplary embodiment of the invention.

FIG. 8 is a timing diagram depicting the operation of image sensor 100 in non-binning and binning modes according to an exemplary embodiment of the invention. In non-binning mode, image sensor 100 operates like a conventional image sensor. Accordingly, pixels of array 200 are read out row by row and a pixel signal is obtained for each pixel individually. As shown in FIG. 8, NBin goes high to close switch 763, thereby shorting transistor 765 to the power supply Vdd. When NBin is high, switch 769 is also conductive to permit output of individual pixel signals through the non-binning output line 777. Also, Bin goes low (when NBin goes high) to open switches 761 and 762, thereby disconnecting column lines 301a, 301b from ground and connecting the input of column circuit 111 to the source regions 739 of the pixel source follower transistors 333 via column lines 301a, 301b.

In the binning mode, NBin goes low to open switch 763, thereby removing the short across transistor 765. Additionally, when switch 763 is open an input of current binning circuitry 760 is connected to the drain regions 738 of the pixel source follower transistors 333 of each pixel of element 202 via lines 701a, 701b. Also, when NBin goes low, switch 769 is opened, preventing the output of pixel signals through non-binning output line 777. When Bin goes high (at the same time NBin goes low) switches 761 and 762 close to connect column lines 301a, 301b to ground. Further, when Bin goes high, switch 768 is closed to permit the output of binned pixel signals through binning output line 778. Thereby, the image sensor 100 is operated in the two-by-two binning mode and the pixel signals for the four pixels of element 202 are simultaneously binned and read out.

According to the exemplary embodiments described above in connection with FIGS. 2-8, pixel signals of elements including four pixels can be binned. The invention, however, is not so limited. Image sensor 100 can also include elements with more than four pixels, allowing pixel signals from more than four pixels to be simultaneously binned. Further, according to the exemplary embodiment described below in connection with FIGS. 9-11, image sensor 100 can be operated in different binning modes, such that in different binning modes, different numbers of pixel signals are binned together.

Figure 9:
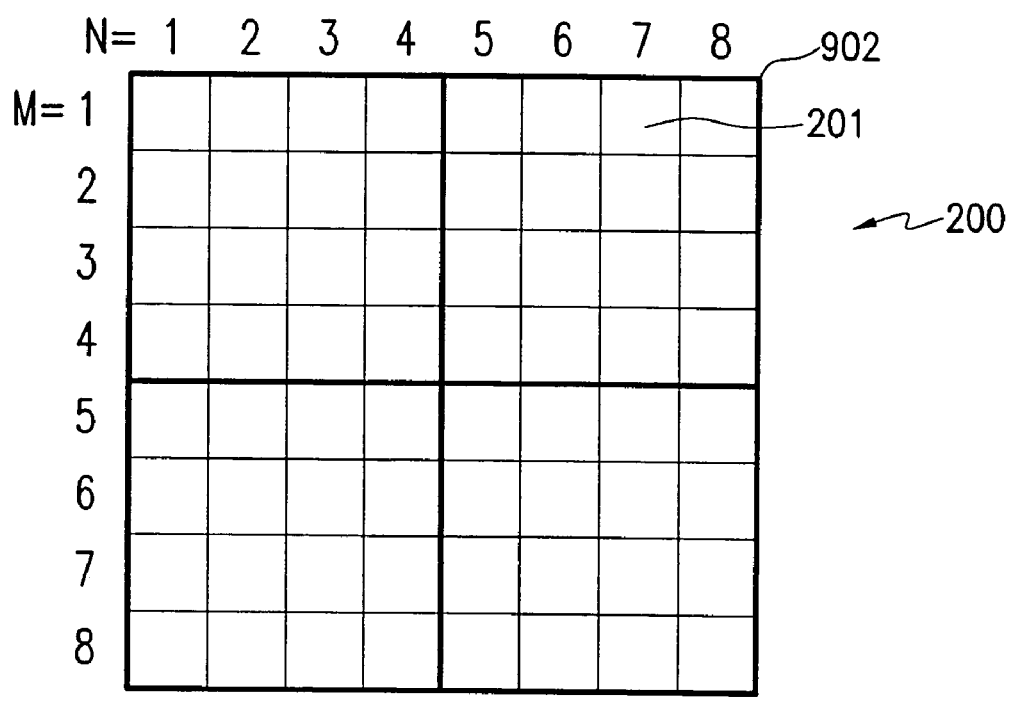
FIG. 9 is a block diagram of the array illustrated in FIG. 1 according to another exemplary embodiment of the invention.

FIG. 9 depicts array 200 having a four-by-four pixel element 902, which includes 16 pixels 201 spanning four adjacent rows and four adjacent columns. When the image sensor 100 is operated in a four-by-four pixel binning mode, pixel signals of element 902 are binned.

Figure 10:
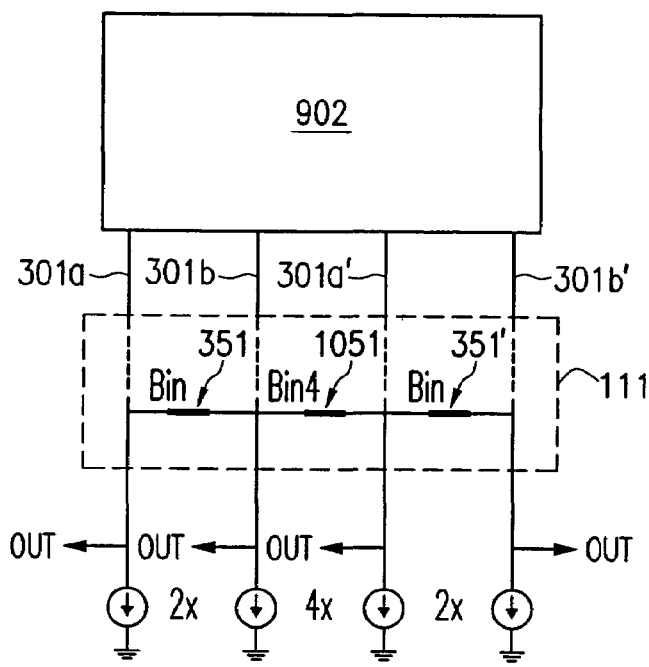
FIGS. 10-11 are diagrams of an element of the array of FIG. 9 and column circuitry associated with the element according to exemplary embodiments of the invention.

FIG. 10 depicts the portion of column circuit 111 for the four-by-four binning operation according to an exemplary embodiment of the invention. The column circuit 111 shown in FIG. 10 is similar to that shown in FIG. 3. Accordingly, in the illustrated embodiment of FIG. 10, binning of the pixel signals of element 902 is implemented by voltage summation on column lines 301a, 301b, 301a', 301b'.

As shown in FIG. 10, the structure of the column circuitry for the four-by-four binning mode includes the same column circuit 111 for a two-by-two binning operation (FIG. 3) plus the following additional circuitry. For the four-by-four binning mode, column circuit 111 also includes switch 1051 between two adjacent pairs of column lines 301a/301b, 301a'/301b', where each pair is switchably connected by a respective switch 351, 351'. In FIG. 10, and other figures herein, the notation "'" is used for clarity to distinguish between the structures depicted in a figure. The same reference numerals with and without "'" denote similar structures within a figure. Accordingly, the description of, for example, switch 351 in connection with FIG. 3 also applies to switch 351' in FIG. 10. When conductive, switch 1051 connects column lines 301b and 301a'. Switch 1051 is controlled by a Bin 4 signal indicating four-by-four binning mode. Therefore, when all three switches 351, 351', 1051 are conductive, the four column lines 301a, 301b, 301a', 301b' are connected allowing the binning of pixel signals between the four columns of element 902. Additionally, for binning of pixel signals between rows of element 902, all four rows of element 902 are simultaneously selected for readout by respective ROW X signals.

In the four-by-four binning mode, the operation of image sensor 100 is similar to that described above in connection with FIG. 5 with the following modifications. At the same time the signals ROW 1 and ROW 2 shown in FIG. 5 go high, signals ROW 3 and ROW 4 go high to select additional rows 3 and 4, respectively, and Bin4 goes high to close switch 1051. Thereby, the image sensor 100 is operated in the four-by-four binning mode and the pixel signals for the sixteen pixels of element 902 are simultaneously binned and read out.

In the embodiment illustrated in FIG. 10, the image sensor 100 can be operated in all of the non-binning, two-by-two binning, and four-by-four binning modes. Alternatively, the image sensor 100 can be configured to operate solely in non-binning and four-by-four binning modes. In such a case, the Bin4 signal, as described above, could operate all three switches 351, 351', 1051, and the Bin signal could be eliminated.

Figure 11:
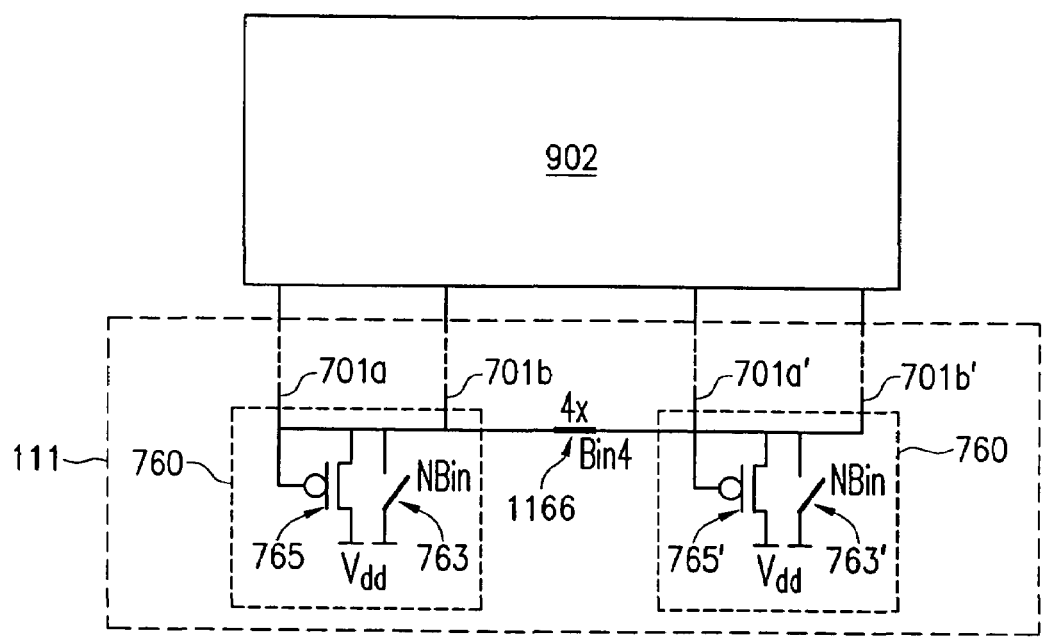

FIG. 11 is a diagram depicting the portion of column circuit 111 for the four-by-four binning operation according to another exemplary embodiment of the invention. The column circuit 111 shown in FIG. 11 is similar to that shown in FIG. 7. Accordingly, in the exemplary embodiment of FIG. 11, binning of the pixel signals of element 902 is implemented by current summation via lines 701a, 701b, 701a', 701b'.

As shown in FIG. 11, the structure of the column circuit 111 for the four-by-four binning operation includes the same column circuit 111 for the two-by-two binning operation (FIG. 7) plus the following additional circuitry. For simplicity, only a portion of the current binning circuitry 760 is depicted in detail. For the four-by-four binning operation, column circuit 111 further includes switch 1166 between two adjacent current binning circuits 760. When conductive, switch 1166 allows the combination of the loads on the two PMOS transistors 765, 765' to bin pixel signals between columns of element 902. Switch 1166 is controlled by a Bin4 signal. Additionally, for binning of pixel signals between rows of element 902, all four rows of element 902 are simultaneously selected for readout by respective ROW X signals.

In the four-by-four binning mode, the operation of image sensor 100 is similar to that described above in connection with FIG. 8 with the following modifications. At the same time Bin goes high, a Bin4 signal goes high to close switch 1166. Thereby, the image sensor 100 is operated in the four-by-four binning mode and the pixel signals for the sixteen pixels of element 902 are simultaneously binned and read out.

In the embodiment illustrated in FIG. 10, the image sensor 100 can be operated in all of the non-binning, two-by-two binning, and four-by-four binning modes. Alternatively, image sensor can be configured to operate solely in the non-binning and four-by-four binning modes. In such a case, switch 1166 could be eliminated and current binning circuits 765 and 765' could remain connected. Also, the signals as illustrated in FIG. 8 without modification could operate image sensor 100 in the four-by-four binning mode.

Figure 12:
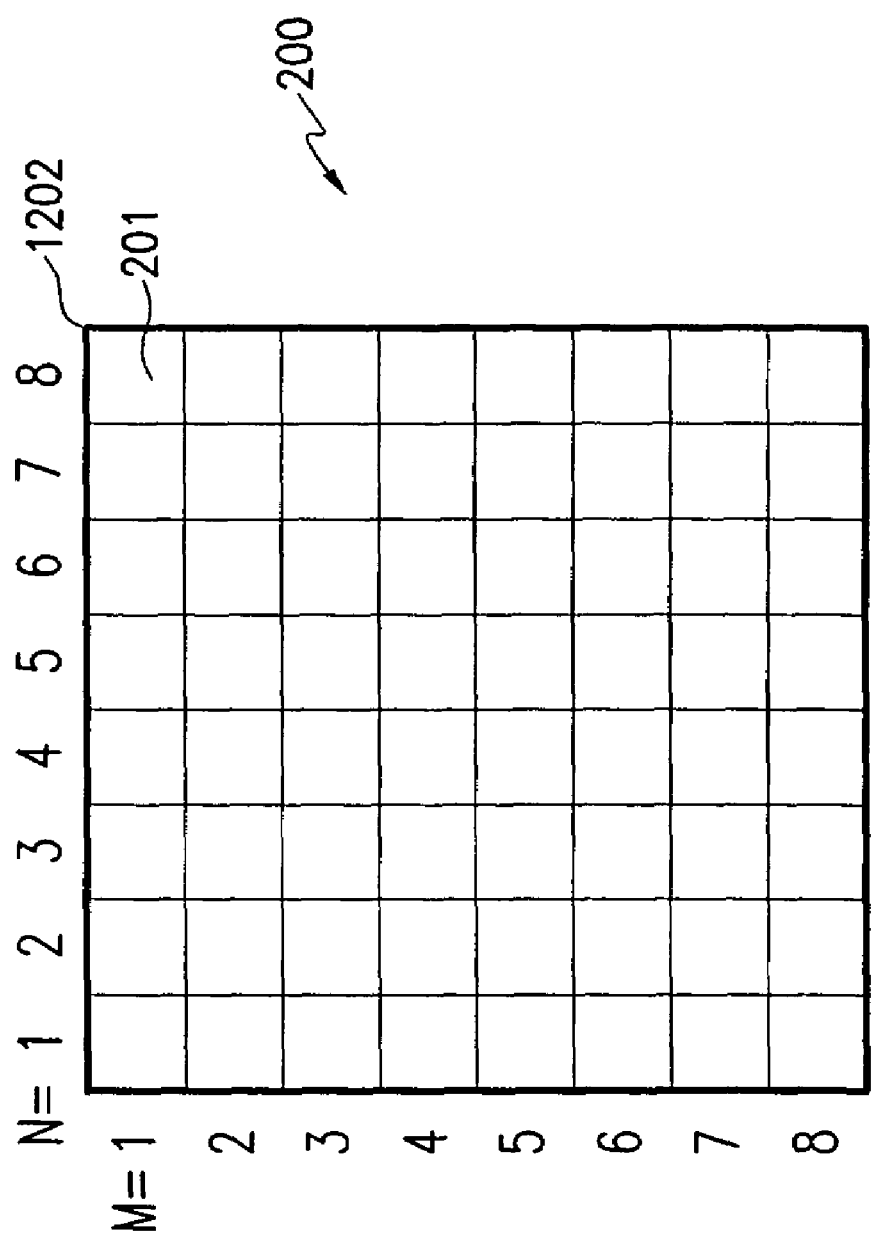
FIG. 12 is a block diagram of the array illustrated in FIG. 1 according to another exemplary embodiment of the invention.

FIG. 12 depicts an eight-by-eight pixel element 1202, which includes 64 pixels spanning eight adjacent rows and eight adjacent columns. In the illustrated embodiment, element 1202 includes all pixels of array 200. When image sensor 100 is operated in the eight-by-eight pixel mode, pixel signals of element 1202 are binned.

Figure 13:
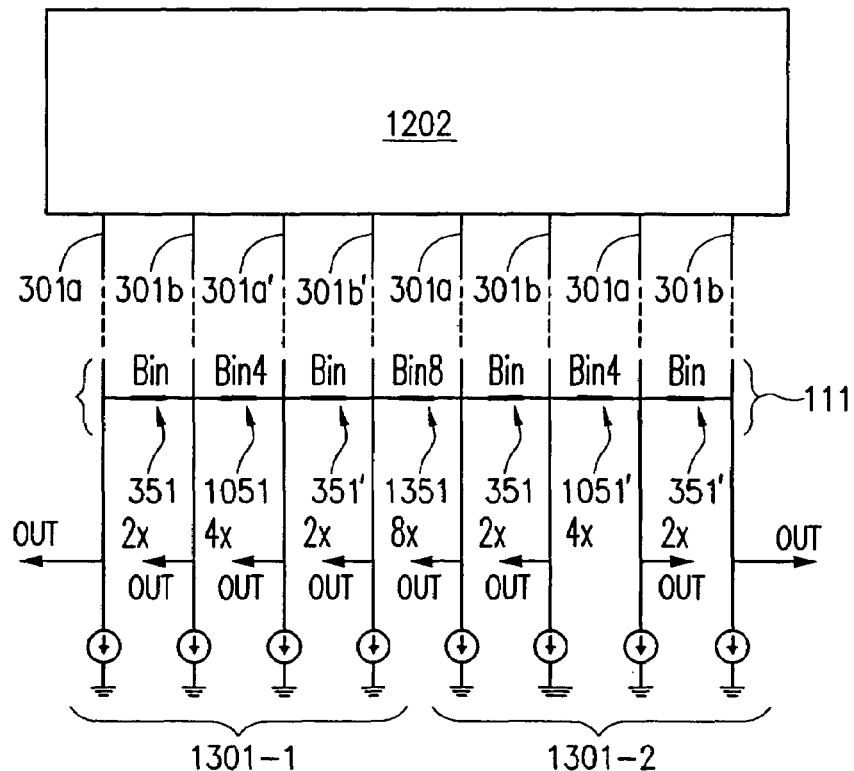
FIG. 13-14 are diagrams of an element of the array of FIG. 12 and column circuitry associated with the element according to exemplary embodiments of the invention.

FIG. 13 depicts the portion of column circuit 111 for the eight-by-eight binning operation according to an exemplary embodiment of the invention. The column circuit 111 shown in FIG. 13 is similar to that shown in FIGS. 3 and 10. Accordingly, in the exemplary embodiment of FIG. 13, binning of the pixel signals of element 1202 is implemented by voltage summation via column lines 301*a*, 301*b*, 301*a'*, 301*b'*. As shown in FIG. 13, the structure of the column circuitry for the eight-by-eight binning mode includes the same column circuitry for the two-by-two binning mode (FIG. 3) and the four-by-four binning mode (FIG. 10) plus the following additional circuitry. For the eight-by-eight binning mode, column circuit 111 further includes switch 1351 between two adjacent sets 1301-1, 1301-2 of column lines 301*a*/301*b*//301*a'*/301*b'* and 301*a*/301*b*//301*a*/301*b*. Switch 1351 is controlled by a Bin8 signal.

As shown in FIG. 13, column lines of each set 1301-1, 1301-2 are switchably connected by a group of three switches 351/1051/351' and 351/1051'/351, respectively. When all switches 351, 1051, 351', 1351, 351, 1051', 351 are conductive, pixel signals of the columns of element 1202 can be binned. Additionally, for binning of pixel signals between rows of element 1202, all eight rows of element 1202 are simultaneously selected for readout by respective ROW X signals.

In the eight-by-eight binning mode, the operation of image sensor 100 is similar to that described above in connection with FIGS. 5 and 11 with the following modifications. At the same time the signals ROW 1 and ROW 2 shown in FIG. 5 go high, signals ROW 3-ROW 8 go high to select additional rows 3-8, respectively; Bin4 goes high to activate switch 1051; and Bin8 goes high to activate switch 1351. Thereby, the image sensor 100 is operated in the eight-by-eight binning mode and the pixel signals for the sixty-four pixels of element 1202 are simultaneously binned and read out.

In the embodiment illustrated in FIG. 10, the image sensor 100 can be operated in all of the non-binning, two-by-two binning, four-by-four binning, and eight-by-eight binning modes. Alternatively, image sensor 100 can be configured to operate in fewer binning modes. For example, image sensor 100 can be configured to operate solely in the non-binning and eight-by-eight binning modes. In such a case, a Bin8 signal could operate all switches 351, 1051, 351', 1351, 351, 1051' and 351, and the Bin and Bin4 signals could be eliminated.

Figure 14:
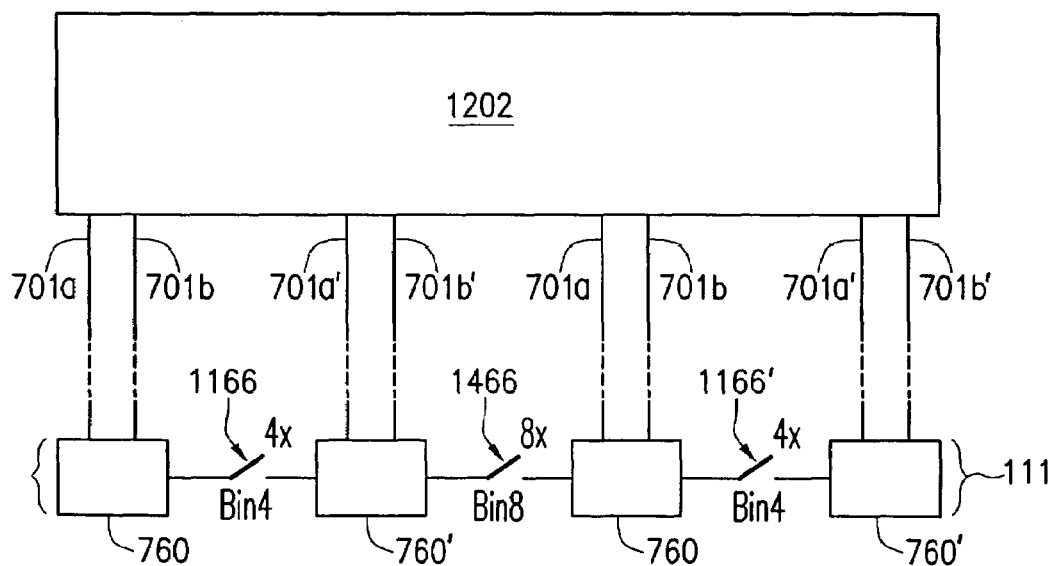

FIG. 14 is a diagram depicting column circuit 111 for the eight-by-eight binning mode according to another exemplary embodiment of the invention. The column circuit 111 shown in FIG. 14 is similar to that shown in FIGS. 7 and 11. Accordingly, in the illustrated embodiment of FIG. 14, binning of the pixel signals of element 1202 is implemented by current summation via lines 701*a*, 701*b*, 701*a'*, 701*b'*.

As shown in FIG. 14, the structure of the column circuit 111 for the eight-by-eight binning mode includes the same column circuitry for the two-by-two binning mode (FIG. 7) and the four-by-four binning mode (FIG. 11) plus the following additional circuitry. For the eight-by-eight binning mode, column circuit 111 further includes a switch 1466, which is controlled by a Bin8 signal, between two adjacent current binning circuits 760, 760'. When conductive, switch 1466, in combination with switches 1166, 1166', allows the combination of the loads on the four PMOS transistors 765, 765' (FIGS. 7 and 11) to bin pixel signals between eight columns of element 1202. Additionally, for binning of pixel signals between rows of element 1202, all eight rows of element 1202 are simultaneously selected for readout by respective ROW X signals.

In the eight-by-eight binning mode, the operation of image sensor 100 is similar to that described above in connection with FIGS. 8 and 11 with the following modifications. At the same time Bin goes high, a Bin4 signal and a Bin8 signal go high to close switches 1166, 1166', and 1466, respectively. Thereby, the image sensor 100 is operated in the eight-by-eight binning mode and the pixel signals for the sixty-four pixels of element 1202 are simultaneously binned and read out.

In the embodiment illustrated in FIG. 10, the image sensor 100 is operated in all of the non-binning, two-by-two binning, four-by-four binning, and eight-by-eight binning modes. Alternatively, image sensor 100 can be configured to operate in fewer binning modes. For example, image sensor 100 can be configured to operate solely in the non-binning and eight-by-eight binning modes. In such a case, switches 1166, 1166', and 1466 could be eliminated and current binning circuitry 760, 760', 760, and 760 would remain connected. Also, the signals of FIG. 8, without modification, could operate image sensor 100 in the eight-by-eight binning mode.

While elements of pixels have been described above as including pixels from specific numbers of rows and columns and pixels from an equal number of columns and rows, the invention is not so limited. Accordingly, elements can include pixels from different numbers of columns and rows and can includes pixels from one number of columns and a different number of rows. For example, an element can include-pixels in 10 rows and 10 columns. Also, an element can include pixels from two columns and four rows.

Figure 15:
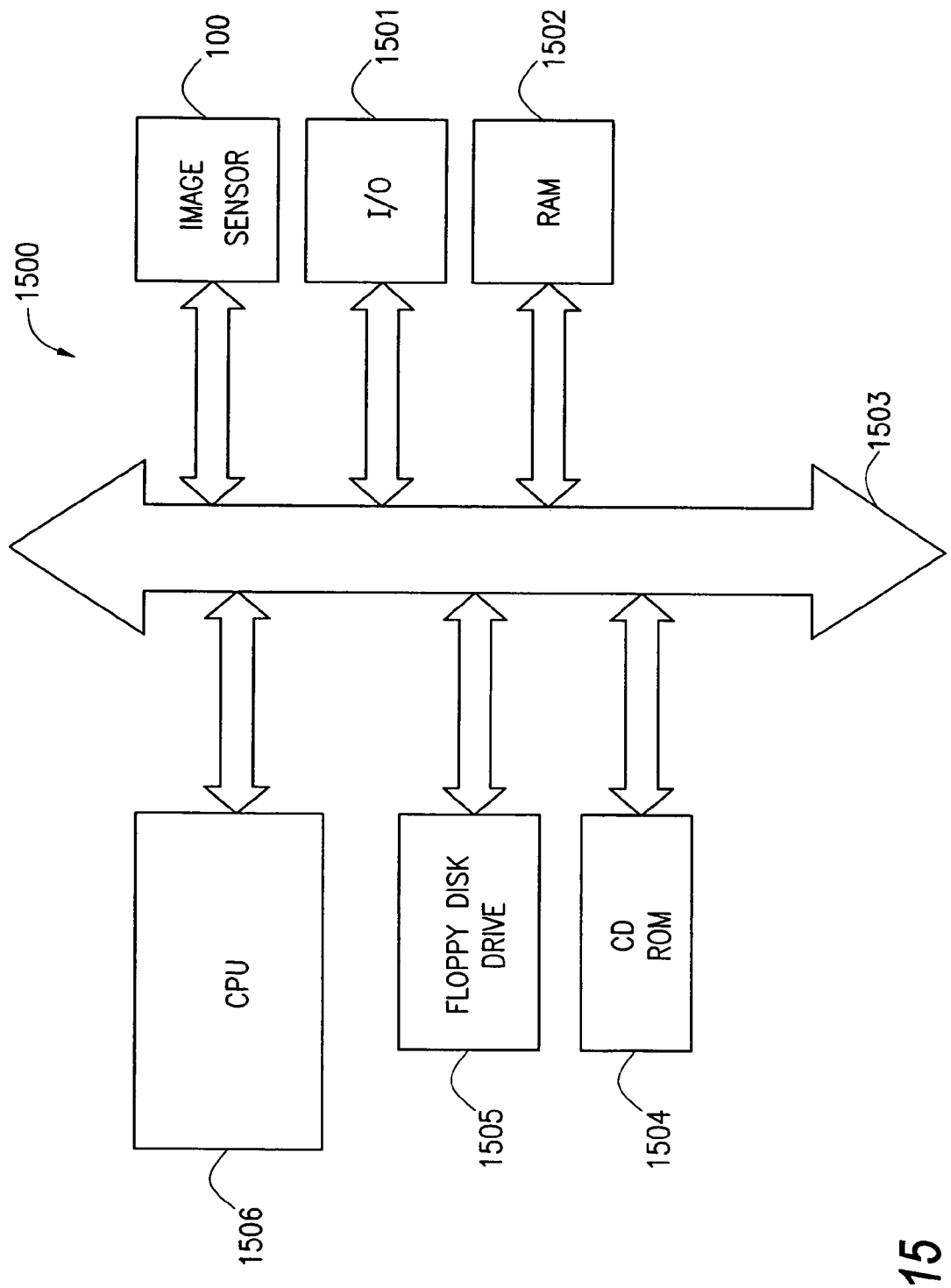
FIG. 15 is a block diagram of a processor system, which includes the image sensor of FIG. 1.

FIG. 15 illustrates a processor based system 1500, which includes a CMOS image sensor 100 according to the exemplary embodiments of FIGS. 1-14. The processor based system 1500 is exemplary of a system having digital circuits, which could include an image sensor. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

The processor system 1500, such as a computer system, for example generally comprises a central processing unit (CPU) 1506, for example, a microprocessor, which communicates with an input/output (I/O) device 1501 over a bus 1503. The image sensor 100 also communicates with the system over bus 1503. The processor system 1500 also includes random access memory (RAM) 1502, and, in the case of a computer system may include peripheral devices such as a floppy disk drive 1505, or a compact disk (CD) ROM drive 1504 which also communicate with CPU 1506 over the bus 1503. It may also be desirable to integrate the processor 1500, image sensor 100 and memory 1502 on a single IC chip.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method of binning pixel signals produced by a pixel array having a plurality of pixels arranged in at least two rows and two columns, each column in the array having first and second column lines, each pixel having a source follower transistor having a first source/drain region connected to its respective first column line and a second source/drain region connected to a row select switch, the row select switch for switchably connecting the second source/drain region to its respective second column line, the method comprising:
    selecting at least one row of pixels;
    outputting pixel signals from the selected pixels to each of the respective first column lines; and
    operating a binning circuit to simultaneously bin pixel signals from at least two first column lines to obtain a binned pixel signal.

2. The method of claim 1, wherein the act of selecting at least one row of pixels comprises selecting a plurality of rows of pixels.

3. The method of claim 1, wherein the act of simultaneously binning pixel signals comprises binning four pixel signals, the pixel signals being from pixels in two rows and two columns.

4. The method of claim 1, wherein the act of simultaneously binning pixel signals comprises binning sixteen pixel signals, the pixel signals being from pixels in four rows and four columns.

5. The method of claim 1, wherein the act of simultaneously binning pixel signals comprises binning sixty-four pixel signals, the pixel signals being from pixels in eight rows and eight columns.

6. A method of operating an image sensor having an array of pixels arranged in rows and columns, wherein the array comprises pixels in n columns, where n is equal to or greater than 8, each column in the array having a column line, each column line being switchably connectable to at least one pixel by a respective row select switch, each column line being connected to a binning circuit, said binning circuit comprising n-1 switches adapted to connect adjacent columns in the array, the method comprising:
    operating the image sensor in a binning mode by using the binning circuit to simultaneously connect each pair of adjacent column lines into binning groups comprised of at least one pair of adjacent column lines;
    connecting at least one pixel to each of the column lines in each of the respective binning groups to simultaneously bin the pixel signals from the pixels to obtain binned pixel signals; and
    reading out the binned pixel signals.

7. The method of claim 6, wherein the act of operating the image sensor in the binning mode comprises simultaneously binning pixel voltage signals.

8. The method of claim 6, further comprising operating the image sensor in a non-binning mode by operating the binning circuit to disconnect all of the column lines.

9. A method of operating an image sensor, the method comprising:
    providing an array of pixel arranged in columns and rows;
    providing n binning lines, each binning line being connected to respective source follower transistor source/drain regions of at least two pixels in a respective column, the source follower transistors being of a first conductivity type, where n is equal to or greater than 2;
    providing n column lines, each column line switchably connected to a ground potential;
    in a binning mode, binning pixel signals from pixels in at least two columns by outputting the pixel signal through a current binning circuit, the current binning circuit comprising a transistor of a second conductivity type, a gate and a first source/drain region of the second conductivity type transistor connected to at least two of the binning lines associated with the at least two columns and a second source/drain region of the first conductivity type transistor connected to a voltage supply; and
    reading out the binned pixel signals.

10. The method of claim 9, further comprising:
    in the binning mode, connecting the n column lines to the ground potential.

11. The method of claim 10, further comprising:
    switching from the binning mode to a non-binning mode by disconnecting the n column lines from the ground potential and shorting the second conductivity type transistor to a voltage supply; and
    reading out each pixel signal individually.

12. The method of claim 9, wherein the act of simultaneously binning the pixel signals comprises binning pixel current signals.

13. The method of claim 11, wherein the act of reading out each pixel signal individually comprises reading out pixel voltage signals.

14. The method of claim 9, further comprising:
    providing a plurality of current binning circuits, each current binning circuit switchably connected to at least one other current binning circuit; and
    during the binning mode, connecting at least one current binning circuit to another current binning circuit.

15. The method of claim 1, wherein the act of selecting at least one row of pixels comprises selecting two adjacent rows of pixels and wherein the act of simultaneously binning pixel signals comprises binning pixels from two adjacent columns.

16. The method of claim 1, wherein the act of selecting at least one row of pixels comprises selecting four adjacent rows of pixels and wherein the act of simultaneously binning pixel signals comprises binning pixels from four adjacent columns.

17. The method of claim 9, further including the step of providing row select switches for each of the pixels in a column connected to a respective binning line and operating the row select switches to connect the pixels in two adjacent rows to their respective binning lines.

18. The method of claim 17, wherein the act of binning pixel signals in at least two columns by outputting the pixel signal through a current binning circuit comprises binning pixel signals from two adjacent columns.

19. The method of claim 9, further including the step of providing row select switches for each of the pixels in a column connected to a respective binning line and operating the row select switches to connect the pixels in four adjacent rows to their respective binning lines.

20. The method of claim 19, wherein the act of binning pixel signals in at least two columns by outputting the pixel signal through a current binning circuit comprises binning pixel signals from four adjacent columns.

* * * * *

UNITED STATES PATENT AND TRADEMARK OFFICE
CERTIFICATE OF CORRECTION

PATENT NO. : 7,402,789 B2  Page 1 of 1
APPLICATION NO. : 11/476018
DATED : July 22, 2008
INVENTOR(S) : Bock It is certified that error appears in the above-identified patent and that said Letters Patent is hereby corrected as shown below:

In column 10, line 1, in Claim 9, delete "sensor,the" and insert -- sensor, the --, therefor.

In column 10, line 21, in Claim 10, after "comprising:" insert -- providing n column lines, each column line switchably connected to a ground potential; --.

Signed and Sealed this

Thirty-first Day of March, 2009

JOHN DOLL
*Acting Director of the United States Patent and Trademark Office*